| (12) | United States Patent<br>Yamakawa | (10) Patent No.: US 12,304,121 B2<br>(45) Date of Patent: May 20, 2025 |
|---|---|---|

(54) IMPRINT APPARATUS AND ARTICLE MANUFACTURING METHOD

(71) Applicant: CANON KABUSHIKI KAISHA, Tokyo (JP)

(72) Inventor: Yushi Yamakawa, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 124 days.

(21) Appl. No.: 18/058,917

(22) Filed: Nov. 28, 2022

(65) Prior Publication Data

US 2023/0182356 A1    Jun. 15, 2023

(30) Foreign Application Priority Data

Dec. 15, 2021 (JP) .................. 2021-203217

(51) Int. Cl.
*B29C 43/58* (2006.01)
*B29C 43/04* (2006.01)
*B29C 59/02* (2006.01)

(52) U.S. Cl.
CPC .............. *B29C 43/58* (2013.01); *B29C 43/04* (2013.01); *B29C 59/02* (2013.01); *B29C 2043/5833* (2013.01)

(58) Field of Classification Search
CPC ........................ B29C 59/02; B29C 2043/5833
USPC ...................................... 264/40.5
See application file for complete search history.

(56) References Cited

U.S. PATENT DOCUMENTS

2011/0147970 A1* 6/2011 Sato ..................... B82Y 40/00
                                                              425/150
2013/0134616 A1    5/2013 Sato

FOREIGN PATENT DOCUMENTS

JP           4185941 B2 *  11/2008
JP       2013138175 A       7/2013

OTHER PUBLICATIONS

English translation of JP4185941 (Year: 2008).*

* cited by examiner

*Primary Examiner* — Jeffrey M Wollschlager
*Assistant Examiner* — Xue H Liu
(74) *Attorney, Agent, or Firm* — ROSSI, KIMMS & McDOWELL LLP

(57) ABSTRACT

The imprint apparatus according to the present invention includes a mold holding unit configured to be movable with holding a mold, a moving body configured to be movable with holding a substrate, a detecting unit configured to detect a position of mold-side marks formed in a pattern region of the mold and a position of substrate-side marks formed in a shot region on the substrate, a measuring unit configured to measure a relative position between the mold holding unit and the moving body, and a controller configured to control a movement of the moving body based on a result of the detection by the detecting unit when an imprint process is performed in a normal shot region, and to control the movement of the moving body based on a result of the measurement by the measuring unit when the imprint process is performed in a deficient shot region.

29 Claims, 7 Drawing Sheets

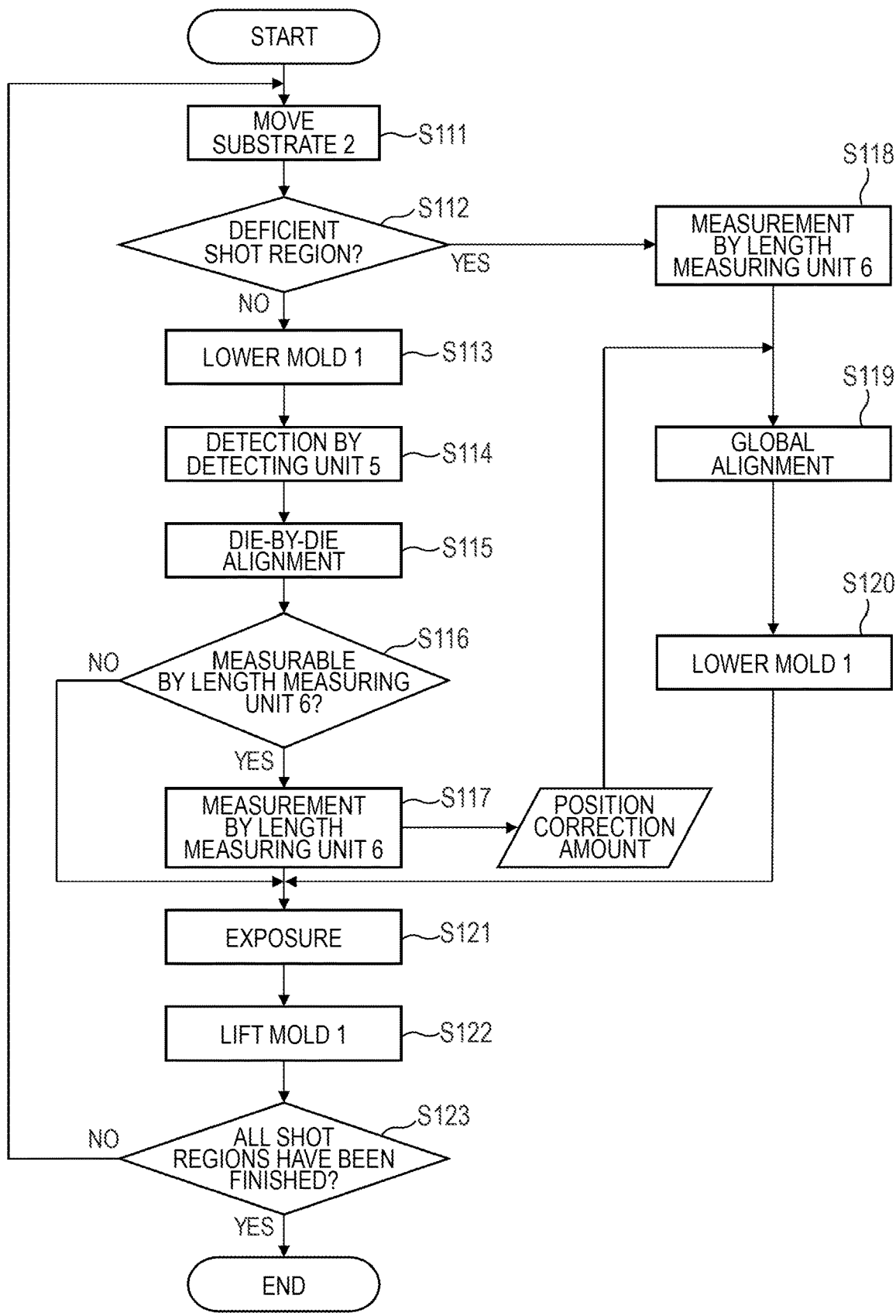

IMPRINT APPARATUS AND ARTICLE MANUFACTURING METHOD

BACKGROUND OF THE INVENTION

Field of the Invention

The present invention is related to an imprint apparatus.

Description of the Related Art

Conventionally, there is a case where it is required to improve a productivity by forming a pattern of an imprint material also in a so-called deficient shot region having a shape partially lacking with respect to a normal shot region on a substrate in an imprint apparatus.

On the other hand, since such deficient shot region has a partially deficient shape, at least one of a plurality of substrate-side marks used to determine a shape and a position when forming the pattern of the imprint material may not be formed.

In this case, it is difficult to perform an alignment of the deficient shot region with respect to the pattern region with a high accuracy from a detection result of mold-side marks formed in the pattern region of the mold and the substrate-side marks formed in the deficient shot region.

Japanese Patent Application Laid-open No. 2013-138175 discloses the imprint apparatus which calculates to correct the shape and the position of the deficient shot region based on the detection result of the substrate-side marks formed in the normal shot region when the pattern of the imprint material is formed in the deficient shot region.

The relative shape and position of the shot region itself with respect to the pattern region can be determined with a high accuracy from the detection result of the mold-side marks formed in the pattern region of the mold and the substrate-side marks formed in the shot region.

However, the detection result does not have highly accurate information about the position of the shot region in the substrate, namely a relative relation about the shape and the position among the shot regions.

Accordingly, the accuracy of the shape and the position of the deficient shot region calculated based on the detection result of the substrate-side marks formed in the normal shot region as in the imprint apparatus disclosed in Japanese Patent Application Laid-open No. 2013-138175 is insufficient.

SUMMARY OF THE INVENTION

An object of the present invention provides the imprint apparatus capable of performing the alignment between the mold and the substrate with a high accuracy even when the pattern of the imprint material is formed in the deficient shot region.

The imprint apparatus according to the present invention includes a mold holding unit configured to be movable with holding a mold, a moving body configured to be movable with holding a substrate, a detecting unit configured to detect a position of at least one mold-side mark formed in a pattern region of the mold and a position of at least one substrate-side mark formed in a shot region on the substrate, a first measuring unit configured to perform a first measurement of measuring a relative position between the mold holding unit and the moving body, and a controller configured to be able to perform a control of the detection by the detecting unit, a control of the first measurement by the first measuring unit, a first control of controlling a movement of the moving body based on a result of the detection by the detecting unit, and a second control of controlling the movement of the moving body based on a result of the first measurement by the first measuring unit. At least one normal shot region in which the at least one substrate-side mark used in the first control is formed and at least one deficient shot region in which at least one of the at least one substrate-side mark used in the first control is not formed are provided on the substrate. The controller is configured to perform the first control when an imprint process is performed in the normal shot region, and to perform the second control when the imprint process is performed in the deficient shot region.

Further features of the present invention will become apparent from the following description of exemplary embodiments with reference to the attached drawings.

BRIEF DESCRIPTION OF THE DRAWINGS

FIG. 5 is a flowchart showing an imprint process in the imprint apparatus according to the first embodiment.

DESCRIPTION OF THE EMBODIMENTS

Figure 1:
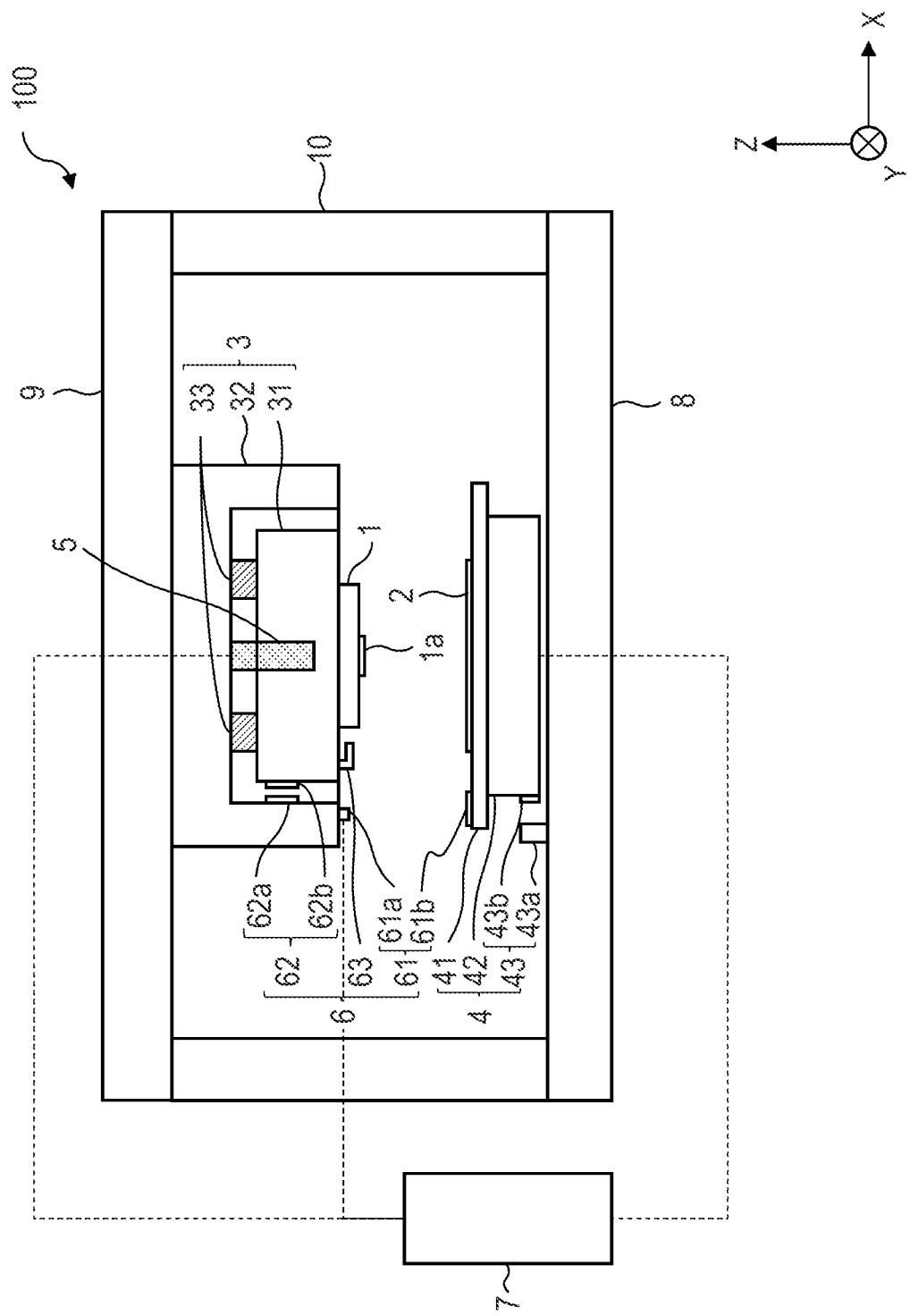
FIG. 1 is a schematic cross-sectional view of an imprint apparatus according to a first embodiment of the present invention.

Hereinafter, an imprint apparatus according to the present invention is described in detail with reference to the accompanying drawings. Note that the drawings shown below are drawn on a scale different from the actual scale in order to facilitate understanding of the present invention.

Further, a direction perpendicular to a substrate surface of a substrate 2 is defined as a Z direction, and two directions perpendicular to each other in a plane parallel to the substrate surface of the substrate 2 are defined as an X direction and a Y direction, respectively.

First Embodiment

Recently, since there has been an increasing demand for miniaturization in a semiconductor device, a micro electro mechanical system (MEMS) or the like, an imprint technique capable of forming a fine pattern (structure) on the order of several nanometers on a substrate has attracted attention in addition to a conventional photolithography technique.

Specifically, the imprint technique is a fine processing technique in which a pattern of an imprint material corresponding to a fine uneven pattern formed on a mold is formed on the substrate by bringing the imprint material and the mold into contact with each other after an uncured imprint material is supplied (applied) onto the substrate.

In an imprint apparatus employing such imprint technique, a position relation and a shot shape deviation between a substrate and a mold are corrected by optically detecting a plurality of marks formed in a predetermined shot region on the substrate when a pattern of an imprint material is formed in the predetermined shot region. Such correction is called die-by-die alignment.

On the other hand, in the vicinity of an edge on the substrate, there is generally provided a so-called deficient shot region in which the entire pattern formed on the mold cannot be transferred since it has a shape partially lacking with respect to a normal shot region.

Then, productivity may be improved by forming the pattern of the imprint material even in such deficient shot region in the imprint apparatus.

Here, it is difficult to perform the die-by-die alignment with a high accuracy for the deficient shot region when at least one of the plurality of marks is not formed in the deficient shot region.

Accordingly, there has been known a conventional method of calculating to correct a shape and a position of the deficient shot region from a result of the die-by-die alignment in the normal shot region when the pattern of the imprint material in the deficient shot region is formed.

That is, in the method, the shot shape of the deficient shot region is first calculated by correcting the shot shape measured for the normal shot region provided in the vicinity of the deficient shot region when the pattern of the imprint material is formed in the deficient shot region.

Next, the marks formed in the deficient shot region are detected, and then the position relation between the pattern region of the mold and the deficient shot region is calculated by removing an influence of the shot shape calculated as described above from the detection result.

Thereby, the alignment between the pattern region of the mold and the deficient shot region can be performed based on the calculated position relation.

However, the position relation between the pattern region of the mold and the deficient shot region is erroneously calculated when the shot shape calculated in the deficient shot region and the actual shot shape are different from each other in the above-described method.

Accordingly, it becomes difficult to perform the alignment between the pattern region of the mold and the deficient shot region with a high accuracy.

An object of the present invention is to provide the imprint apparatus capable of performing the alignment between the mold and the substrate with a high accuracy even when the pattern of the imprint material in the deficient shot region is formed.

FIG. 1 shows a schematic cross-sectional view of an imprint apparatus 100 according to a first embodiment of the present invention.

The imprint apparatus 100 according to the present embodiment is used to manufacture a device such as a semiconductor device as an article, specifically it is a lithography apparatus for performing an imprint process of forming a pattern of an imprint material on a substrate by using a mold.

Specifically, a pattern of a cured product to which an uneven pattern of the mold is transferred can be formed on the substrate by applying energy for curing to the imprint material after the imprint material supplied onto the substrate and the mold are brought into contact with each other in the imprint apparatus 100 according to the present embodiment.

A curable composition (also referred to as an uncured resin) which is cured by an application of energy for curing is used as an imprint material in the imprint apparatus 100 according to the present embodiment.

As the energy for curing, an electromagnetic wave, heat or the like is used. A wavelength of the electromagnetic wave used is selected from a range between 10 nm and 1 mm for example, namely light such as an infrared ray, an visible ray and an ultraviolet ray is used.

The imprint material may be applied in a form of a film onto the substrate by a spin coater or a slit coater in the imprint apparatus 100 according to the present embodiment.

Further, the imprint material may be applied onto the substrate by a liquid ejecting head in a form of a droplet, an island formed by connecting a plurality of droplets, or a film.

A viscosity (viscosity at 25° C.) of the imprint material is within a range of 1 mPa·s or more and 100 mPa·s or less, for example.

In the imprint apparatus 100 according to the present embodiment, a glass, a ceramic, a metal, a semiconductor, a resin or the like may be used as the material of the substrate, and a member made of a material different from that of the substrate may be formed on the substrate surface as necessary.

Specifically, examples of the substrate used in the imprint apparatus 100 according to the present embodiment include a silicon wafer, a compound semiconductor wafer and a quartz glass.

As shown in FIG. 1, the imprint apparatus 100 according to the present embodiment includes a mold holding unit 3, a substrate stage 4 (a moving body), a detecting unit 5, a length measuring unit 6, a controller 7, a stage base plate 8, a bridge base plate 9 and support columns 10.

The substrate stage 4 is placed on the stage base plate 8, and the mold holding unit 3 is fixed to the bridge base plate 9.

The support columns 10 are supported by the stage base plate 8 and also support the bridge base plate 9.

Further, a vibration isolator (not illustrated) is provided on a base plate (not illustrated) supported from a floor in the imprint apparatus 100 according to the present embodiment, and the vibration isolator can support the stage base plate 8 to reduce a vibration propagating from the floor to the stage base plate 8.

The imprint apparatus 100 according to the present embodiment is also provided with a mold conveying unit (not illustrated) which conveys the mold 1 from outside to the mold holding unit 3, a substrate conveying unit (not illustrated) which conveys the substrate 2 from outside to the substrate stage 4, and the like.

The mold holding unit 3 is configured to be movable with holding the mold 1, specifically includes a movable element 31 (a movable portion), a fixed element 32 (a fixed portion) and a movable element lifting mechanism 33.

The movable element 31 holds the mold 1 by attracting the mold 1 with a vacuum suction force or an electrostatic force.

When the movable element 31 holds the mold 1 by the vacuum suction force, the movable element 31 is connected to a vacuum pump (not illustrated) provided outside the imprint apparatus 100 according to the present embodiment. The mold 1 is attached and detached (held and released) by switching on and off of the vacuum pump.

The fixed element 32 is fixed to the bridge base plate 9. The movable element lifting mechanism 33 is formed by a voice coil motor, for example, and is fixed to the movable element 31 and the fixed element 32, so that it can move the movable element 31 in the Z direction.

This makes it possible to perform an imprint process on the imprint material supplied onto the substrate 2.

The movable element lifting mechanism 33 may be formed by a plurality of driving systems so as to be able to control not only a position of the movable element 31 in the Z direction but also a tilt with respect to the Z direction.

The substrate stage 4 is configured to be movable with holding the substrate 2 so as to change a position of the substrate 2 in the XY plane, specifically includes a top plate 41, a driving unit 42 and a first length measuring system 43 (a second measuring unit).

The first length measuring system 43 includes a first encoder head 43a and a first encoder scale 43b in the imprint apparatus 100 according to the present embodiment.

Further, the first encoder head 43a is fixed to the stage base plate 8 (a reference member), and the first encoder scale 43b is fixed to the substrate stage 4.

The first encoder head 43a may be fixed to the substrate stage 4, and the first encoder scale 43b may be fixed to the stage base plate 8.

In addition, the first length measuring system 43 may be formed by an interference displacement meter, a laser displacement meter or the like, and in this case, a relative position between the support column 10 as a reference member and the substrate stage 4 may be measured, for example.

The first length measuring system 43 can measure the position of the substrate stage 4 in the XY plane with respect to a reference member such as the stage base plate 8 in real time according to the above-described structure (a fourth measurement).

Then, the controller 7 can control the movement of the substrate stage 4 for performing the alignment of the substrate 2 based on the measured value by the first length measuring system 43.

The controller 7 is formed by a computer including a CPU, a memory and the like, and controls each unit of the imprint apparatus 100 according to the present embodiment in accordance with a program stored in the memory.

Specifically, the controller 7 controls the imprint process of forming the pattern of the imprint material on the substrate 2 by controlling an operation, an adjustment and the like of each unit provided in the imprint apparatus 100 according to the present embodiment.

More specifically, the controller 7 is configured so as to be able to control the substrate stage 4, the detecting unit 5 and the length measuring unit 6.

The detecting unit 5 includes a scope which can optically detect (observe) at least one mold-side mark 201 formed in the pattern region 1a of the mold 1 and at least one substrate-side mark 202 formed in each of a plurality of shot regions 50 on the substrate 2.

Figure 2A:
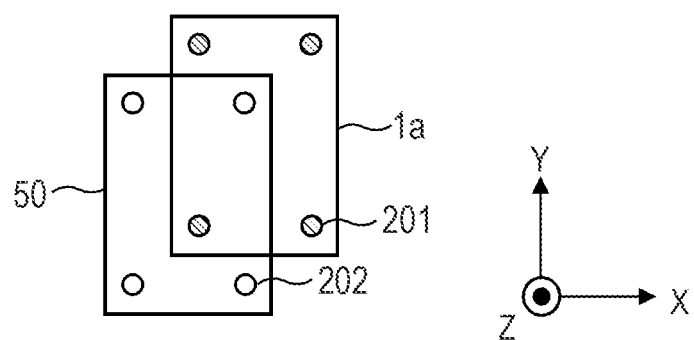
FIG. 2A is a top view of a pattern region of a mold and a shot region on a substrate in the imprint apparatus according to the first embodiment.

FIG. 2A shows a schematic view of the mold-side marks 201 formed in the pattern region 1a of the mold 1 and the substrate-side marks 202 formed in the shot region 50 on the substrate 2 as viewed from the Z direction.

Note that the detecting unit 5 may detect the relative position between the mold-side marks 201 and the substrate-side marks 202 in the XY plane.

Accordingly, the detecting unit 5 may be formed by a scope provided with an optical system for pickuping an image of both of the mold-side marks 201 and the substrate-side marks 202 simultaneously, or may be formed by a scope for detecting an interference signal therebetween or a signal due to a synergistic effect such as moire.

Further, the detecting unit 5 may not be able to detect both of the mold-side marks 201 and the substrate-side marks 202 simultaneously.

That is, the detecting unit 5 may detect the relative position between the mold-side marks 201 and the substrate-side marks 202 in the XY plane by obtaining respective positions of the mold-side marks 201 and the substrate-side marks 202 with respect to a reference position provided inside the detecting unit 5.

In the imprint apparatus 100 according to the present embodiment, the plurality of mold-side marks 201 are formed in the pattern region 1a of the mold 1, and the plurality of substrate-side marks 202 are formed in the shot region 50 on the substrate 2.

Specifically, four mold-side marks 201 are formed so as to be provided at four corners of the rectangular pattern region 1a, and four substrate-side marks 202 are formed so as to be provided at four corners of the rectangular shot region 50 as shown in FIG. 2A, for example.

Then, it is possible to calculate a shape difference including a shift, a rotation, a magnification deviation and the like between the pattern region 1a of the mold 1 and the shot region 50 on the substrate 2 by detecting the relative positions in the XY plane between the plurality of mold-side marks 201 and the plurality of substrate-side marks 202.

Figure 2B:
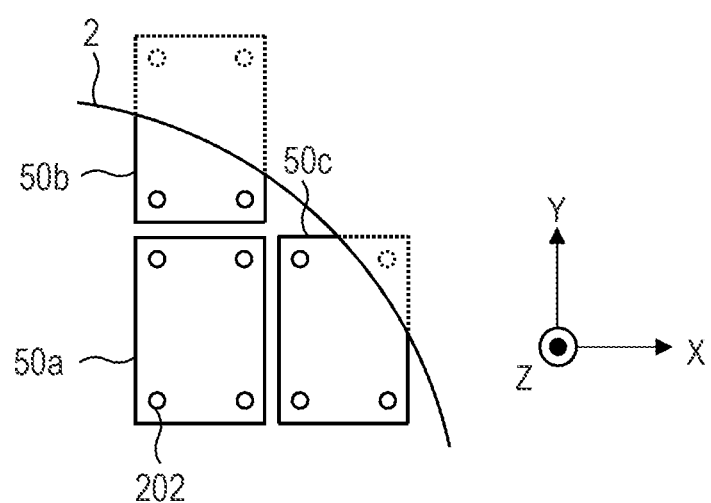
FIG. 2B is a top view of the shot region on the substrate in the imprint apparatus according to the first embodiment.

FIG. 2B shows an enlarged top view of a region in the vicinity of a predetermined edge of the substrate surface of the substrate 2 used in the imprint apparatus 100 according to the present embodiment.

As shown in FIG. 2B, shot regions 50a, 50b and 50c are provided in the region of the substrate 2.

Specifically, four substrate-side marks 202 are formed in the shot region 50a. Then, the detecting unit 5 can detect the four substrate-side marks 202 and the four mold-side marks 201 formed in the pattern region 1a to calculate two components about the shift, one component about the rotation, two components about the magnification deviation, and three components about other deformation deviations, for example.

When the imprint process is performed on the shot region 50a, the controller 7 can control the movement of the substrate stage 4 based on the calculation result to perform the alignment of the shot region 50a with a high accuracy.

A method of performing the alignment by calculating the shape difference including the shift, the rotation, the magnification deviation and the like between the pattern region 1a of the mold 1 and the shot region 50 on the substrate 2 from the detection result by the detecting unit 5 in this manner is called a die-by-die alignment method.

On the other hand, at least one of the four substrate-side marks 202 is not formed in the shot regions 50b and 50c.

Specifically, two substrate-side marks 202 are formed in the shot region 50b, and three substrate-side marks 202 are formed in the shot region 50c.

Accordingly, when the die-by-die alignment is performed in such shot regions 50b and 50c by using the detecting unit 5, the number of components indicating the shape difference including the shift, the rotation, the magnification deviation and the like which can be calculated is reduced, which leads to a deterioration in an alignment accuracy.

Hereinafter, the shot region 50 in which all of the four substrate-side marks 202 are formed as the shot region 50a is referred to as a normal shot region 50.

On the other hand, a shot region 50 in which at least one of the four substrate-side marks 202 is not formed as the shot regions 50b and 50c, is referred to as a deficient shot region 50.

The length measuring unit 6 (a first measuring unit) includes a second length measuring system 61, a third length measuring system 62 and a fourth length measuring system 63, and can measure a relative position between the mold holding unit 3, namely the mold 1 and the substrate stage 4.

Here, when a change in the relative position between the substrate 2 and the substrate stage 4 is sufficiently small, it can be regarded that the length measuring unit 6 measures the relative position between the mold 1 and the substrate 2.

As shown in FIG. 1, the second length measuring system 61 includes a second encoder head 61a and a second encoder scale 61b.

The second encoder scale 61b has a structure of a two-dimensional encoder scale.

In the second length measuring system 61, the second encoder head 61a is fixed to the fixed element 32 of the mold holding unit 3, and the second encoder scale 61b is fixed to the top plate 41 of the substrate stage 4.

As described above, since the second encoder head 61a is fixed in the imprint apparatus 100, namely is fixed to the fixed element 32 which does not move, a cable and the like connected to the second encoder head 61a can be easily arranged.

Alternatively, the second encoder head 61a may be fixed to the top plate 41 and the second encoder scale 61b may be fixed to the fixed element 32.

Further, the second encoder scale 61b may be fixed to a portion other than the top plate 41 of the substrate stage 4.

FIGS. 3A to 3D each show a top view of the substrate stage 4 arranged at a predetermined position.

In FIGS. 3A to 3D, the second encoder head 61a fixed to the fixed element 32 of the mold holding unit 3 is also shown.

Figure 3A:
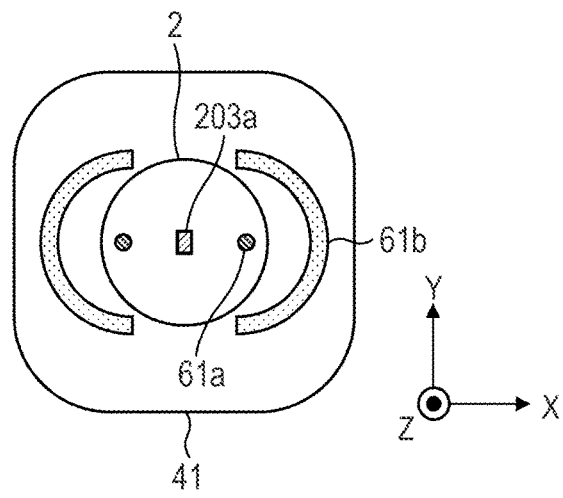
FIG. 3A is a top view of a substrate stage in the imprint apparatus according to the first embodiment.
Figure 3B:
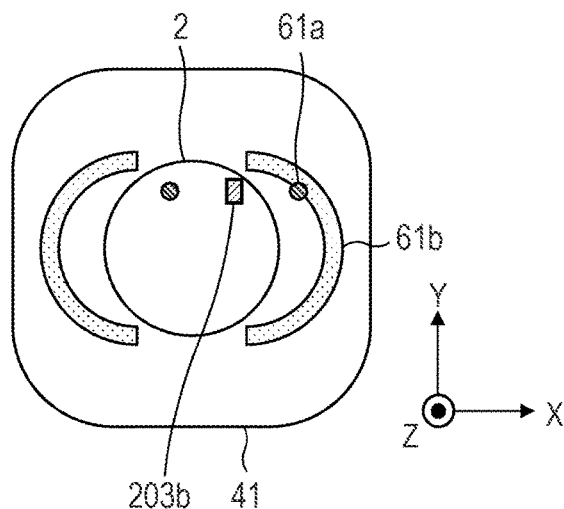
FIG. 3B is a top view of the substrate stage in the imprint apparatus according to the first embodiment.
Figure 3C:
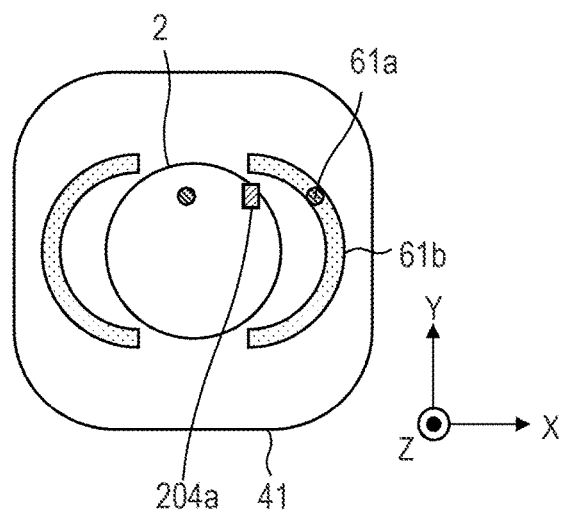
FIG. 3C is a top view of the substrate stage in the imprint apparatus according to the first embodiment.
Figure 3D:
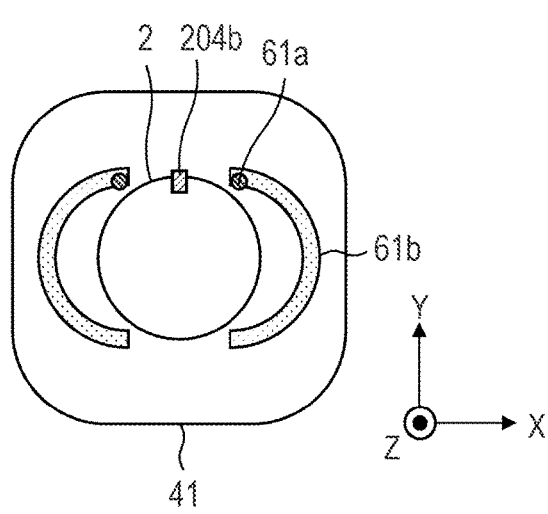
FIG. 3D is a top view of the substrate stage in the imprint apparatus according to the first embodiment.

In the example shown in FIGS. 3A and 3D, two sets of the second encoder head 61a and the second encoder scale 61b are provided as the second length measuring system 61, and the two sets are spaced apart from each other.

Each of the second encoder heads 61a in the two sets is attached to a predetermined position of the fixed element 32 of the mold holding unit 3.

The second encoder scale 61b has an arc shape, and is arranged on the top plate 41 of the substrate stage 4 such that the corresponding second encoder head 61a is arranged at a center of the arc in the XY plane when a center of the substrate 2 is arranged immediately below the pattern region 1a as shown in FIG. 3A.

The second encoder scale 61b does not need to have an arc shape as a whole as long as it has an arc-shaped portion as described above.

FIG. 3A shows an arrangement of the substrate stage 4 when the imprint process is performed on a normal shot region 203a provided at the center of the substrate 2.

In this case, the second encoder head 61a and the second encoder scale 61b do not overlap each other in the XY plane.

Accordingly, the relative position between the mold 1 and the substrate 2 cannot be measured by using the second length measuring system 61, and the position of the substrate 2 is adjusted by performing the die-by-die alignment (a first control, a first controlling step).

FIG. 3B shows an arrangement of the substrate stage 4 when the imprint process is performed on a normal shot region 203b provided in the vicinity of a predetermined edge of the substrate surface of the substrate 2.

In this case, a part of the second encoder head 61a included in one set overlaps with the corresponding second encoder scale 61b in the XY plane.

Accordingly, the relative position between the mold 1 and the substrate 2 can be measured by using the second length measuring system 61 when the normal shot region 203b is arranged immediately below the pattern region 1a for performing the imprint process on the normal shot region 203b.

Hereinafter, a process of adjusting the position of the substrate 2 by measuring the relative position between the mold 1 and the substrate 2 using the length measuring unit 6 is referred to as a global alignment.

Since all of the four substrate-side marks 202 are formed in the normal shot region 203b, the position of the substrate 2 can also be adjusted by performing the die-by-die alignment using the detecting unit 5.

FIG. 3C shows an arrangement of the substrate stage 4 when the imprint process is performed on a deficient shot region 204a provided in the vicinity of a predetermined edge of the substrate 2.

In this case, the second encoder head 61a included in one set overlaps with the corresponding second encoder scale 61b in the XY plane.

Accordingly, the position of the substrate 2 can be adjusted by performing the global alignment using the second length measuring system 61 when the deficient shot region 204a is arranged immediately below the pattern region 1a for performing the imprint process on the deficient shot region 204a (a second control, a second controlling step).

On the other hand, since at least one of the four substrate-side marks 202 is not formed in the deficient shot region 204a as described above, a deterioration in alignment accuracy is caused when the position of the substrate 2 is adjusted by the die-by-die alignment.

Accordingly, the position of the substrate 2 is adjusted by the global alignment to suppress the deterioration in alignment accuracy when the imprint process is performed on the deficient shot region 50 provided in the vicinity of an edge of the substrate 2 such as the deficient shot region 204a in the imprint apparatus 100 according to the present embodiment.

FIG. 3D shows an arrangement of the substrate stage 4 when the imprint process is performed on a deficient shot region 204b provided in the vicinity of another predetermined edge of the substrate 2.

In this case, a part of each of the second encoder heads 61a included in both sets overlaps with the corresponding second encoder scale 61b in the XY plane.

Accordingly, the position of the substrate 2 can be adjusted by performing the global alignment using the second length measuring system 61 when the deficient shot region 204b is arranged immediately below the pattern region 1a for performing the imprint process on the deficient shot region 204b.

When the second length measuring system 61 is formed by the two sets of the second encoder head 61a and the second encoder scale 61b as described above, it is preferred that each of the sets is arranged so as to be switchable as shown in FIGS. 3B to 3D.

That is, at least a part of the second encoder head 61a in at least one set may overlap the corresponding second encoder scale 61b when any of the normal shot region 50 and the deficient shot region 50 provided in the vicinity of an edge of the substrate 2 is arranged immediately below the pattern region 1a.

In the second length measuring system 61, a three-dimensional encoder scale may be used instead of a two-dimensional encoder scale as the second encoder scale 61b.

In this case, it is also possible to measure the relative position between the top plate 41 and the fixed element 32 in the Z direction, namely the relative position between the substrate 2 and the mold 1 in the Z direction.

In addition, it is possible to measure a relative difference between tilts of the top plate 41 and the fixed element 32 with respect to the XY plane by providing a plurality of sets of the second encoder head 61a and the second encoder scale 61b which is formed by the three-dimensional encoder scale.

Then, a drive of the movable element 31 may be controlled based on the relative difference thus measured.

Figure 4A:
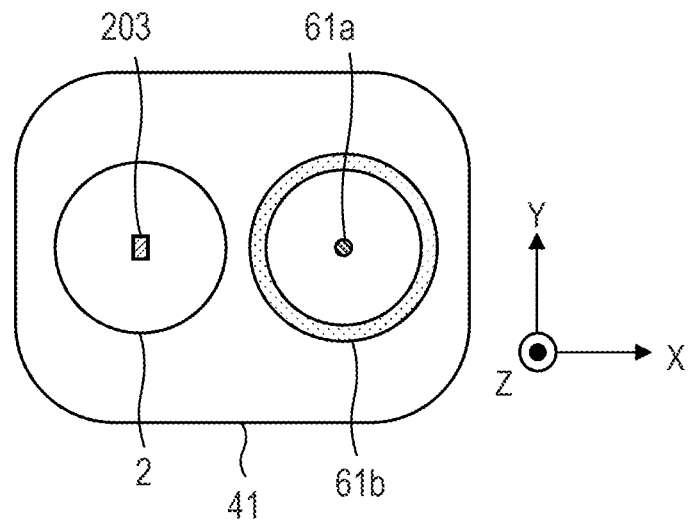
FIG. 4A is a top view showing another structure of a length measuring unit in the imprint apparatus according to the first embodiment.
Figure 4B:
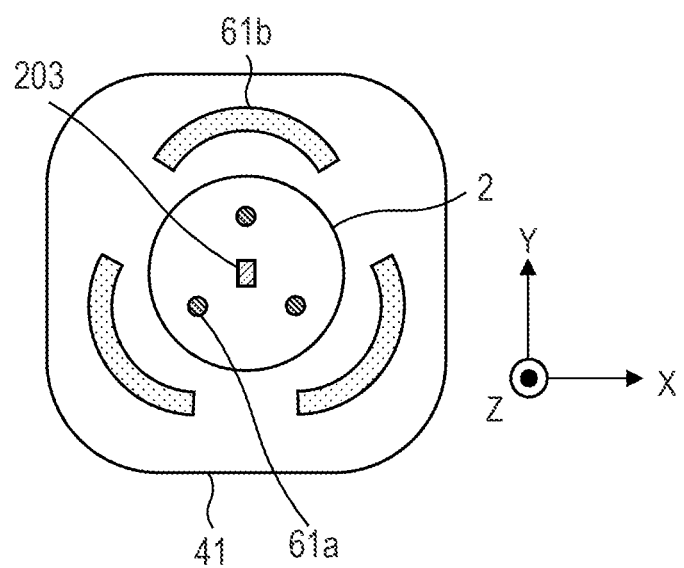
FIG. 4B is a top view showing still another configuration of the length measuring unit in the imprint apparatus according to the first embodiment.

FIGS. 4A and 4B each show another structure of the second length measuring system 61 in the imprint apparatus 100 according to the present embodiment.

In the example shown in FIG. 4A, one set of the second encoder head 61a and the second encoder scale 61b is provided as the second length measuring system 61.

The second encoder scale 61b has a circular shape, and is arranged on the top plate 41 of the substrate stage 4 such that the second encoder head 61a is arranged at a center of the circle in the XY plane when the center of the substrate 2 is arranged immediately below the pattern region 1a.

Further, in the example shown in FIG. 4B, three sets of the second encoder head 61a and the second encoder scale 61b are provided as the second length measuring system 61, and the three sets are separated from each other.

Specifically, each of the three second encoder heads 61a is arranged at a vertex of a predetermined regular triangle, and is fixed to the fixed element 32 of the mold holding unit 3 such that the pattern region 1a of the mold 1 is arranged at a gravity center of the regular triangle.

Each of the three second encoder scales 61b has an arc shape, and is arranged on the top plate 41 of the substrate stage 4 such that the corresponding second encoder head 61a is arranged at a center of the arc in the XY plane when a center of the substrate 2 is arranged immediately below the pattern region 1a.

Here, it is preferred that the second encoder scale 61b has a shape corresponding to an outer shape of the substrate 2 in the XY plane.

That is, the second encoder scale 61b has a shape corresponding to a circle which is the outer shape of the substrate 2 in the XY plane in the imprint apparatus 100 according to the present embodiment.

In other words, a relation of a relative position and a relative shape between the second encoder head 61a and the second encoder scale 61b is not limited to the above as long as it corresponds to a relation between the center and the outer shape of the substrate 2 in the XY plane when the center of the substrate 2 is arranged immediately below the pattern region 1a of the mold 1.

Further, in a case where a plurality of sets of the second encoder head 61a and the second encoder scale 61b are provided as the second length measuring system 61 as described in FIGS. 3A to 3D and 4B, each set may correspond to the relation between the center of the substrate 2 and the corresponding outer shape in the XY plane.

As described above, among the substrate-side marks 202 used in the die-by-die alignment, a plurality of normal shot regions 50 in which all of them are formed and a plurality of deficient shot regions 50 in which at least one of them is not formed are provided on the substrate 2 used in the imprint apparatus 100 according to the present embodiment.

The second length measuring system 61 can measure a relative position between the mold holding unit 3 and the substrate stage 4 when a predetermined shot region 50 among all of the deficient shot regions 50 and at least one normal shot region 50 is moved to a position where the imprint process can be performed (a first measurement).

FIG. 5 shows a flowchart illustrating the imprint process in the imprint apparatus 100 according to the present embodiment. Each step of the imprint process is executed by the controller 7.

As described above, a first imprint process, a second imprint process or a third imprint process described below is selected for each shot region 50 on the substrate 2 in the imprint process performed by the imprint apparatus 100 according to the present embodiment.

That is, the first imprint process is the imprint process in which a position of a normal shot region 50 provided inside the substrate surface of the substrate 2 on which the global alignment cannot be performed, such as the normal shot region 203a shown in FIG. 3A is adjusted by the die-by-die alignment.

Further, the second imprint process is the imprint process in which a position of a normal shot region 50 provided in the vicinity of an edge of the substrate surface of the substrate 2 on which both of the global alignment and the die-by-die alignment can be performed, such as the normal shot region 203b shown in FIG. 3B is adjusted by the die-by-die alignment.

At this time, a relation between a position and a shape of the shot region 50 in the die-by-die alignment, and those of the shot region 50 in the global alignment can be obtained by measuring a relative position between the mold 1 and the substrate 2 also by the second length measuring system 61.

Furthermore, the third imprint process is the imprint process in which a position of a deficient shot region 50 provided in the vicinity of an edge of the substrate surface of the substrate 2 where the die-by-die alignment is not preferred, such as the deficient shot region 204a shown in FIG. 3C is adjusted by the global alignment.

As shown in FIG. 5, when the imprint process on the substrate 2 is started, first, the substrate 2 is moved by the substrate stage 4 such that a shot region 50 to be subjected to the imprint process is arranged immediately below the pattern region 1a of the mold 1 from shot layout information on the substrate 2 input in advance to the controller 7 (step S111).

Next, it is determined whether or not the shot region 50 is a deficient shot region from the shot layout information (step S112).

When the shot region 50 is not a deficient shot region (No in the step S112), namely is a normal shot region, the movable element lifting mechanism 33 is operated to lower the mold 1 such that an imprint material on the shot region 50 and the mold 1 are brought into contact with each other (step S113).

Then, the detecting unit 5 detects the mold-side marks 201 formed in the pattern region 1a of the mold 1 and the substrate-side marks 202 formed in the shot region 50 (step S114).

Next, the die-by-die alignment is performed by moving the substrate stage 4 based on the detection result obtained by the detecting unit 5 in the step S114 (step S115).

Then, it is determined whether or not the shot region 50 is a shot region in which a relative position between the mold 1 and the substrate 2 can be measured by the second length measuring system 61 (step S116).

In other words, in the step S116, it is determined whether at least a part of the second encoder head 61a overlaps the corresponding second encoder scale 61b in the XY plane when the shot region 50 is arranged immediately below the pattern region 1a of the mold 1.

When the relative position between the mold 1 and the substrate 2 can be measured by the second length measuring system 61 (Yes in the step S116), the relative position is measured by the second length measuring system 61 (step S117), and the measurement result is stored as a position correction amount. Thereafter, the process proceeds to step S121.

On the other hand, when the relative position between the mold 1 and the substrate 2 cannot be measured by the second length measuring system 61 (No in the step S116), the process proceeds to step S121, and an exposure is performed by irradiating the shot region 50 with exposure light by an illuminating unit (not illustrated).

Then, the movable element lifting mechanism 33 is driven to lift the mold 1 such that the imprint material on the shot region 50 subjected to the exposure and the mold 1 are separated from each other (step S122).

Thereby, a pattern of the cured imprint material is formed on the shot region 50.

Then, it is determined whether the imprint process has been performed on all of the shot regions 50 to be subjected to the imprint process on the substrate 2 (step S123).

When the imprint process has not been performed on all of the shot regions 50 (No in the step S123), the process returns to step S111, and the same process as described above is performed on the shot region 50 on which the imprint process has not been performed.

On the other hand, when the imprint process has been performed on all of the shot regions 50 (Yes in the step S123), the imprint process on the substrate 2 is ended in the imprint apparatus 100 according to the present embodiment.

Returning to the step S112, when the shot region 50 to be subjected to the imprint process is the deficient shot region (Yes in the step S112), the relative position between the mold 1 and the substrate 2 is measured by the second length measuring system 61 (step S118).

Then, the global alignment is performed by moving the substrate stage 4 based on the relative position measured in the step S118 and the relative position stored in the step S117 for the normal shot region 50 previously performed (step S119).

Then, the movable element lifting mechanism 33 is operated to lower the mold 1 such that the imprint material on the shot region 50 and the mold 1 are brought into contact with each other (step S120). Thereafter, the process proceeds to the step S121, and the same process as described above is performed.

When the imprint process is performed on the deficient shot region 50 as described above, the alignment of the deficient shot region 50 can be performed based on the measured value obtained by the second length measuring system 61 for the normal shot region 50 previously performed.

As an origin of the second encoder scale 61b in the second length measuring system 61, it is possible to use the measured position for the normal shot region 50 in which the imprint process is performed first among the normal shot regions 50 which can be measured by the second length measuring system 61.

Further, the origin may be changed every time the imprint process is performed on each of the normal shot regions 50 which can be measured by the second length measuring system 61.

In the above description, the determination process in the step S116 is performed after the die-by-die alignment in the step S115, but the present invention is not limited thereto.

That is, the step S116 may be simultaneously performed at a predetermined timing between the steps S113 to S115.

As shown in FIG. 1, the third length measuring system 62 included in the length measuring unit 6 includes a third encoder head 62a fixed to the fixed element 32 and a third encoder scale 62b which is a two-dimensional encoder scale fixed to the movable element 31.

The third length measuring system 62 may be formed by an interference displacement meter, a laser displacement meter or the like.

The third length measuring system 62 can measure a relative position between the movable element 31 and the fixed element 32 in the YZ plane according to the above-described structure (a third measurement).

Thereby, it is possible to obtain a change in the relative position between the top plate 41 and the movable element 31 by combining the second length measuring system 61 and the third length measuring system 62 with each other, and then the global alignment of the deficient shot region 50 can be performed based on the obtained result.

A relative difference between tilts of the movable element 31 and the fixed element 32 with respect to the YZ plane may be measured by using a three-dimensional encoder scale as the third encoder scale 62b or increasing the number of measurement points of an interferometric displacement meter or a laser displacement meter in the third length measuring system 62 to control a drive of the movable element 31 based on the measurement result.

Further, when the second length measuring system 61 also measures a relative difference between tilts of the top plate 41 and the fixed element 32, a relative difference between the tilts of the top plate 41 and the movable element 31 may be calculated by combining the second length measuring system 61 and the third length measuring system 62 with each other to control the drive of the movable element 31 based on the calculated result.

As shown in FIG. 1, the fourth length measuring system 63 included in the length measuring unit 6 is formed by an interference displacement meter or a laser displacement meter for example, and is fixed to the movable element 31.

Specifically, the fourth length measuring system 63 is arranged so as to be able to measure a change in a relative position between the movable element 31 and the mold 1 in the XY plane by detecting a side surface of the mold 1 (a second measurement).

More specifically, it is possible to measure a relative rotation amount about the Z axis between the movable element 31 and the mold 1 and a deformation amount of an outer shape of the mold 1 by forming the fourth length measuring system 63 by a plurality of interference displacement meters or laser displacement meters so as to detect four side surfaces of the rectangular mold 1 in the XY plane, for example.

Then, it is possible to calculate a change in a relative position between the top plate 41 and the mold 1 by combining the second length measuring system 61, the third length measuring system 62 and the fourth length measuring system 63 with each other to perform the global alignment of the deficient shot region 50 based on the calculated result.

As described above, the controller 7 can determine a driving amount of the substrate stage 4 to control a movement of the substrate stage 4 from the result of the relative position between the mold 1 and the substrate 2 detected by the detecting unit 5 or the relative position measured by the length measuring unit 6.

That is, the controller 7 can switch an alignment method by determining whether the shot region 50 to be subjected to the imprint process is a normal shot region in which all of the four substrate-side marks 202 are formed or a deficient shot region in which some of the four substrate-side marks 202 are not formed.

Figure 6A:
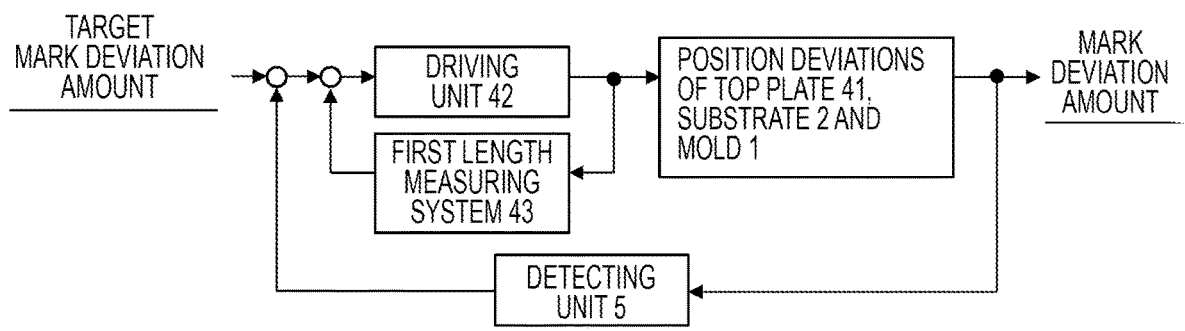
FIG. 6A is a control flow of an alignment in the imprint process in the imprint apparatus according to the first embodiment.
Figure 6B:
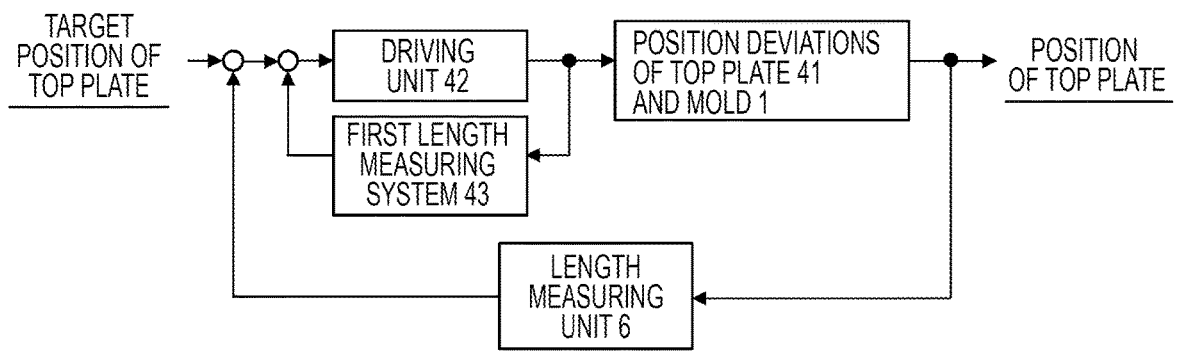
FIG. 6B is a control flow of the alignment in the imprint process in the imprint apparatus according to the first embodiment.
Figure 6C:
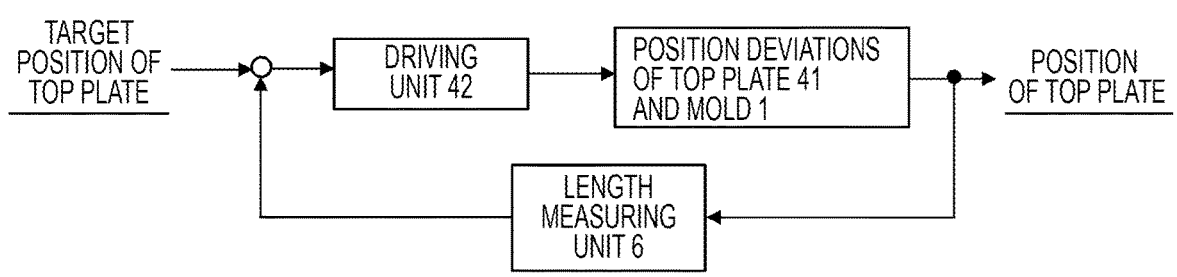
FIG. 6C is a control flow of the alignment in the imprint process in the imprint apparatus according to the first embodiment.

FIGS. 6A, 6B and 6C each show a control flow of the alignment in the imprint process in the imprint apparatus 100 according to the present embodiment.

As described above, when the shot region 50 to be subjected to the imprint process is not a deficient shot region, namely is a normal shot region, the die-by-die alignment is performed on the shot region 50.

The control flow at this time is shown in FIG. 6A, and the controller 7 determines a target mark deviation amount to control the driving unit 42 of the substrate stage 4 based on the determined target mark deviation amount.

At this time, a feedback control is performed on the driving unit 42 based on the measurement result of the first length measuring system 43.

Here, since the driving unit 42 and the top plate 41 are coupled to each other via a plurality of members, moving amounts of the driving unit 42 and the top plate 41 do not necessarily coincide with each other.

In addition, a relative position between the substrate 2 and the top plate 41 or a relative position between the mold 1 and the mold holding unit 3 may change.

Accordingly, the detecting unit 5 performs the feedback control by detecting a shift amount of the mark due to the above-described factors.

On the other hand, when the shot region 50 to be subjected to the imprint process is a deficient shot region, the global alignment is performed on the shot region 50.

The control flow at this time is shown in FIG. 6B, and the controller 7 first determines a target position of the top plate 41 based on the measurement result by the length measuring unit 6 in the normal shot region 50 in the vicinity of an edge of the substrate surface which has been previously performed.

Thereafter, the controller 7 controls the driving unit 42 of the substrate stage 4 so as to move the top plate 41 to the determined target position.

At this time, the feedback control is performed on the driving unit 42 based on the measurement result of the first length measuring system 43.

Here, since the driving unit 42 and the top plate 41 are coupled to each other via the plurality of members, the moving amounts of the driving unit 42 and the top plate 41 do not necessarily coincide with each other. In addition, the relative position between the mold 1 and the mold holding unit 3 may change.

Accordingly, the length measuring unit 6 performs the feedback control by measuring a change in the relative position between the top plate 41 and the mold 1 due to the above-described factors.

Note that a change in the relative position between the substrate 2 and the top plate 41 is not taken into consideration when the global alignment is performed by using the length measuring unit 6 as described above.

Further, the feedback control may be performed by directly using the measurement result of the length measuring unit 6 without using the first length measuring system 43 when the global alignment is performed on the deficient shot region 50 as shown in FIG. 6C.

As described above, in the imprint apparatus 100 according to the present embodiment, the position of the substrate 2 is adjusted by the die-by-die alignment when the imprint process is performed on the normal shot region 50.

On the other hand, the position of the substrate 2 is adjusted by the global alignment when the imprint process is performed on the deficient shot region 50.

Thereby, the alignment between the mold 1 and the substrate 2 can be performed with a high accuracy even when the pattern of the imprint material is formed in the deficient shot region 50.

When the imprint process is performed on the normal shot region 50 provided in the vicinity of an edge of the substrate surface of the substrate 2 as shown in FIG. 3B, the position of the substrate 2 can be measured by using the second length measuring system 61 in addition to the first length measuring system 43.

Here, the second length measuring system 61 measures the position of the top plate 41 of the substrate stage 4 on which the substrate 2 is placed, whereas the first length measuring system 43 measures the position of the driving unit 42 of the substrate stage 4, namely measures the position of a member relatively far from the substrate 2.

Accordingly, when the position of the substrate 2 can be measured by using the second length measuring system 61, it is preferred to measure the position of the substrate 2 by using the second length measuring system 61 instead of the first length measuring system 43.

Further, in the imprint apparatus 100 according to the present embodiment, the die-by-die alignment may be performed in addition to the global alignment when the imprint process is performed on the deficient shot region 50.

Specifically, a shape in the deficient shot region 50 may be corrected using a correction amount obtained by performing the die-by-die alignment on the normal shot region 50 in addition to the global alignment.

In this case, a shape difference between the pattern region 1a of the mold 1 and the normal shot region 50 on the substrate 2 obtained in the step S115 of the flowchart shown in FIG. 5 is stored, for example.

Then, the die-by-die alignment can be performed on the deficient shot region 50 based on the correction amount calculated from the shape difference stored in the normal shot region 50 in addition to the global alignment in the step S119.

Alternatively, the die-by-die alignment may be performed on the deficient shot region 50 by detecting the substrate-side marks 202 formed in the deficient shot region 50 using the detecting unit 5 in addition to the global alignment in the step S119.

In the imprint apparatus 100 according to the present embodiment, the length measuring unit 6 includes the second length measuring system 61, the third length measuring system 62 and the fourth length measuring system 63. However, the present invention is not limited thereto, and there may be a length measuring system omitted as necessary.

Further, in the imprint apparatus 100 according to the present embodiment, the alignment of the deficient shot region 50 can be performed even if any of the substrate-side marks 202 is not formed in the deficient shot region 50 from the above-described structure.

Second Embodiment

Figure 7:
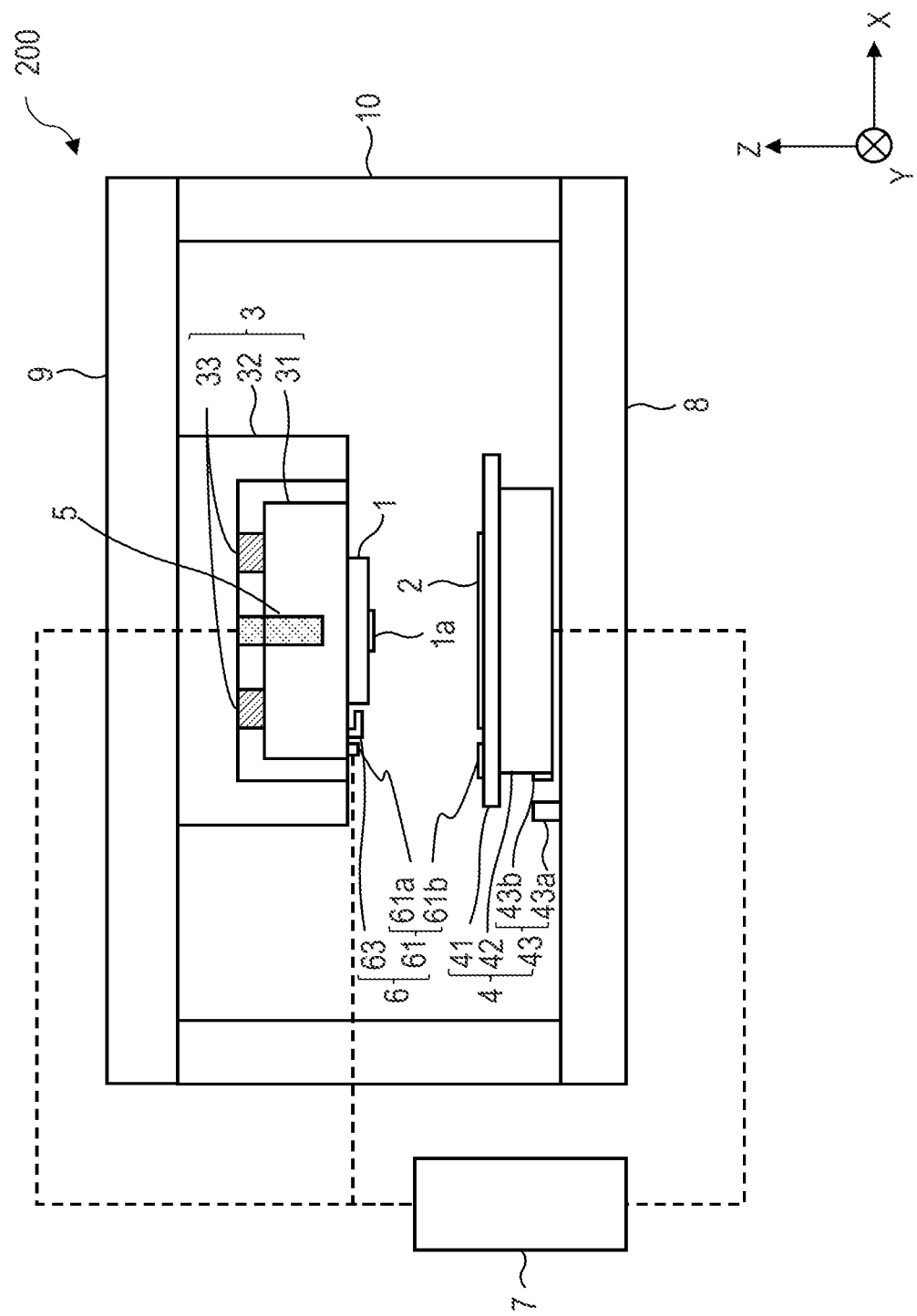
FIG. 7 is a schematic cross-sectional view of an imprint apparatus according to a second embodiment of the present invention.

FIG. 7 shows a schematic cross-sectional view of an imprint apparatus 200 according to a second embodiment of the present invention.

Note that the imprint apparatus 200 according to the present embodiment has the same structure as the imprint apparatus 100 according to the first embodiment except that a structure of the length measuring unit 6 is different, so that the same members are denoted by the same reference numerals and description thereof is omitted.

The length measuring unit 6 provided in the imprint apparatus 200 according to the present embodiment includes the second length measuring system 61 and the fourth length measuring system 63. That is, the third length measuring system 62 is not provided unlike the imprint apparatus 100 according to the first embodiment.

Further, in the second length measuring system 61, the second encoder head 61a is fixed to the movable element 31 instead of the fixed element 32 unlike the imprint apparatus 100 according to the first embodiment.

In the imprint apparatus 200 according to the present embodiment, the global alignment can be performed on the deficient shot region 50 in the imprint process on the substrate 2 as in the imprint apparatus 100 according to the first embodiment.

As described above, in the imprint apparatus 200 according to the present embodiment, the position of the substrate 2 is adjusted by the die-by-die alignment when the imprint process is performed on the normal shot region 50.

On the other hand, the position of the substrate 2 is adjusted by the global alignment when the imprint process is performed on the deficient shot region 50.

Thereby, the alignment between the mold 1 and the substrate 2 can be performed with a high accuracy even when the pattern of the imprint material is formed in the deficient shot region 50.

Further, in the imprint apparatus 200 according to the present embodiment, a relative position between the mold 1 and the substrate 2 can be measured at a position closer to the mold 1 and the substrate 2 than the imprint apparatus 100 according to the first embodiment.

Thereby, the alignment between the mold 1 and the substrate 2 can be performed with a higher accuracy when the pattern of the imprint material is formed in the deficient shot region 50.

In addition, in the imprint apparatus 200 according to the present embodiment, since a relative position between the movable element 31 and the top plate 41 can be measured without providing the third length measuring system 62, the number of components can be reduced compared to the imprint apparatus 100 according to the first embodiment.

According to the present invention, the imprint apparatus capable of performing the alignment between the mold and the substrate with a high accuracy even when the pattern of the imprint material is formed in the deficient shot region, can be provided.

Article Manufacturing Method

A pattern of an imprint material formed by using the imprint apparatus according to the present invention is used permanently in at least a part of various articles or temporarily when manufacturing the various articles.

Examples of the article include an electric circuit element, an optical element, a MEMS, a recording element, a sensor and a mold.

Further, examples of the electric circuit element include volatile or non-volatile semiconductor memories such as a dynamic random access memory (DRAM), a static random access memory (SRAM), a flash memory and a magnetoresistive random access memory (MRAM), and semiconductor elements such as a large scale integration (LSI), a charge coupled device (CCD), an image sensor and a field programmable gate array (FPGA).

Furthermore, an example of the mold includes a mold for imprinting.

The pattern of the imprint material formed by using the imprint apparatus according to the present invention is used as it is as a constituent member of at least a part of the above-described article.

Alternatively, the pattern of the imprint material is temporarily used as a resist mask, and the resist mask is removed after etching, ion implantation or the like is performed in a step for processing a substrate.

Although preferred embodiments have been described above, the present invention is not limited to these embodiments, and various modifications and changes can be made within the gist of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-203217, filed Dec. 15, 2021, which is hereby incorporated by reference herein in its entirety.

What is claimed is:

1. An imprint apparatus comprising:
   a mold holding unit configured to be movable with holding a mold;
   a moving body configured to be movable with holding a substrate;
   a detecting unit configured to detect a position of a mold-side mark formed in a pattern region of the mold and a position of a substrate-side mark formed in a shot region on the substrate;
   a first measuring unit configured to perform a first measurement of measuring a relative position between the mold holding unit and the moving body; and
   a controller configured to be able to perform a control of the detection by the detecting unit, a control of the first measurement by the first measuring unit, a first control of controlling a movement of the moving body based on a result of the detection by the detecting unit, and a second control of controlling the movement of the moving body based on a result of the first measurement by the first measuring unit,
   wherein a normal shot region in which the substrate-side mark used in the first control is formed and a deficient shot region in which the substrate-side mark used in the first control is not formed are provided on the substrate, and wherein the controller is configured to perform the first control when an imprint process is performed in the normal shot region, and to perform the second control when the imprint process is performed in the deficient shot region.

2. The imprint apparatus according to claim 1, wherein the first measuring unit is configured to be able to perform the first measurement when a predetermined shot region among the deficient shot region and the normal shot region is moved to a position where the imprint process can be performed.

3. The imprint apparatus according to claim 2, wherein the controller is configured to:

cause the first measuring unit to perform the first measurement when the imprint process is performed in a predetermined normal shot region, and cause the first measuring unit to perform the first measurement, and then control the movement of the moving body based on a result of the first measurement for each of the predetermined normal shot region and the deficient shot region when the imprint process is performed in the deficient shot region.

4. The imprint apparatus according to claim 1, wherein the mold holding unit includes a movable portion configured to be movable with holding the mold, and a fixed portion to which a driving unit for driving the movable portion is fixed, and wherein the first measuring unit is configured to measure a relative position between the fixed portion and the moving body in the first measurement.

5. The imprint apparatus according to claim 1, wherein the first measuring unit is configured to perform a second measurement of measuring a relative position between the mold holding unit and the mold.

6. The imprint apparatus according to claim 5, wherein the mold holding unit includes a movable portion configured to be movable with holding the mold, and a fixed portion to which a driving unit for driving the movable portion is fixed, and wherein the first measuring unit is configured to measure a relative position between the movable portion and the mold in the second measurement.

7. The imprint apparatus according to claim 5, wherein the controller is configured to calculate a relative position between the mold and the moving body based on results of the first measurement and the second measurement, and then to control the movement of the moving body based on the calculation result in the second control.

8. The imprint apparatus according to claim 1, wherein the mold holding unit includes a movable portion configured to be movable with holding the mold, and a fixed portion to which a driving unit for driving the movable portion is fixed, and wherein the first measuring unit is configured to perform a third measurement of measuring a relative position between the movable portion and the fixed portion.

9. The imprint apparatus according to claim 8, wherein the first measuring unit is configured to measure a relative position between the fixed portion and the moving body in the first measurement, and wherein the controller is configured to calculate a relative position between the movable portion and the moving body based on results of the first measurement and the third measurement, and then to control the movement of the moving body based on the calculation result in the second control.

10. The imprint apparatus according to claim 8, wherein the first measuring unit is configured to perform a second measurement of measuring a relative position between the movable portion and the mold, and wherein the controller is configured to calculate a relative position between the mold and the moving body based on results of the first measurement, the second measurement and the third measurement, and then to control the movement of the moving body based on the calculation result in the second control.

11. The imprint apparatus according to claim 1, further comprising a second measuring unit configured to perform a fourth measurement of measuring a relative position between the moving body and a reference member.

12. The imprint apparatus according to claim 11, wherein the controller is configured to control the movement of the moving body based on a result of the detection and a result of the fourth measurement in the first control.

13. The imprint apparatus according to claim 12, wherein the first measuring unit is configured to be able to perform the first measurement when a predetermined shot region among the deficient shot region and the normal shot region is moved to a position where the imprint process can be performed, and wherein the controller is configured to:

cause the first measuring unit to perform the first measurement when the imprint process is performed in a predetermined normal shot region, and cause the first measuring unit to perform the first measurement, and then control the movement of the moving body based on a result of the first measurement for each of the predetermined normal shot region and the deficient shot region, and a result of the fourth measurement when the imprint process is performed in the deficient shot region.

14. The imprint apparatus according to claim 12, wherein the first measuring unit is configured to be able to perform the first measurement when a predetermined shot region among the deficient shot region and the normal shot region is moved to a position where the imprint process can be performed, and wherein the controller is configured to:

cause the first measuring unit to perform the first measurement when the imprint process is performed in a predetermined normal shot region, and cause the first measuring unit to perform the first measurement, and then control the movement of the moving body based on a result of the first measurement for each of the predetermined normal shot region and the deficient shot region when the imprint process is performed in the deficient shot region.

15. An article manufacturing method for manufacturing an article from a processed substrate, the article manufacturing method comprising:

a step of forming a pattern of an imprint material on a substrate using a mold by using the imprint apparatus according to claim 1; and a step of processing the substrate on which the pattern is formed.

16. A method for controlling a movement of a moving body in an imprint apparatus including a mold holding unit configured to be movable with holding a mold, the moving body configured to be movable with holding a substrate, a detecting unit configured to detect a position of a mold-side mark formed in a pattern region of the mold and a position of a substrate-side mark formed in a shot region on the substrate, a first measuring unit configured to perform a first measurement of measuring a relative position between the mold holding unit and the moving body, and a controller configured to be able to perform a control of the detection by the detecting unit, a control of the first measurement by the first measuring unit, a first control of controlling the movement of the moving body based on a result of the detection by the detecting unit, and a second control of controlling the movement of the moving body based on a result of the first measurement by the first measuring unit, a normal shot region in which the substrate-side mark used in the first control is formed and a deficient shot region in which the substrate-side mark used in the first control is not formed being provided on the substrate, the method comprising:

a first controlling step of performing the first control when an imprint process is performed on the normal shot region; and a second controlling step of performing the second control when the imprint process is performed on the deficient shot region.

17. The method according to claim 16, wherein the first measuring unit is configured to be able to perform the first measurement when a predetermined shot region among the deficient shot region and the normal shot region is moved to a position where the imprint process can be performed.

18. The method according to claim 17,
wherein the first controlling step includes a step of controlling the first measurement when the imprint process is performed on a predetermined normal shot region, and
wherein the second controlling step includes a step of controlling the first measurement, and then controlling the movement of the moving body based on a result of the first measurement for each of the predetermined normal shot region and the deficient shot region when the imprint process is performed in the deficient shot region.

19. The method according to claim 16,
wherein the mold holding unit includes a movable portion configured to be movable with holding the mold, and a fixed portion to which a driving unit for driving the movable portion is fixed, and
wherein the first measuring unit is configured to measure a relative position between the fixed portion and the moving body in the first measurement.

20. The method according to claim 16, wherein the first measuring unit is configured to perform a second measurement of measuring a relative position between the mold holding unit and the mold.

21. The method according to claim 20,
wherein the mold holding unit includes a movable portion configured to be movable with holding the mold, and a fixed portion to which a driving unit for driving the movable portion is fixed, and
wherein the first measuring unit is configured to measure a relative position between the movable portion and the mold in the second measurement.

22. The method according to claim 20, wherein the controller is configured to calculate a relative position between the mold and the moving body based on results of the first measurement and the second measurement, and then to control the movement of the moving body based on the calculation result in the second control.

23. The method according to claim 16,
wherein the mold holding unit includes a movable portion configured to be movable with holding the mold, and a fixed portion to which a driving unit for driving the movable portion is fixed, and
wherein the first measuring unit is configured to perform a third measurement of measuring a relative position between the movable portion and the fixed portion.

24. The method according to claim 23,
wherein the first measuring unit is configured to measure a relative position between the fixed portion and the moving body in the first measurement, and
wherein the controller is configured to calculate a relative position between the movable portion and the moving body based on results of the first measurement and the third measurement, and then to control the movement of the moving body based on the calculation result in the second control.

25. The method according to claim 23,
wherein the first measuring unit is configured to perform a second measurement of measuring a relative position between the movable portion and the mold, and
wherein the controller is configured to calculate a relative position between the mold and the moving body based on results of the first measurement, the second measurement and the third measurement, and then to control the movement of the moving body based on the calculation result in the second control.

26. The method according to claim 16, wherein the imprint apparatus further includes a second measuring unit configured to perform a fourth measurement of measuring a relative position between the moving body and a reference member.

27. The method according to claim 26, wherein the first controlling step includes a step of controlling the movement of the moving body based on a result of the detection and a result of the fourth measurement when the imprint process is performed on the normal shot region.

28. The method according to claim 27,
wherein the first measuring unit is configured to be able to perform the first measurement when a predetermined shot region among the deficient shot region and the normal shot region is moved to a position where the imprint process can be performed,
wherein the first controlling step includes a step of controlling the first measurement when the imprint process is performed on a predetermined normal shot region, and
wherein the second controlling step includes a step of controlling the first measurement, and then controlling the movement of the moving body based on a result of the first measurement for each of the predetermined normal shot region and the deficient shot region, and a result of the fourth measurement when the imprint process is performed in the deficient shot region.

29. The method according to claim 27,
wherein the first measuring unit is configured to be able to perform the first measurement when a predetermined shot region among the deficient shot region and the normal shot region is moved to a position where the imprint process can be performed,
wherein the first controlling step includes a step of controlling the first measurement when the imprint process is performed on a predetermined normal shot region, and
wherein the second controlling step includes a step of controlling the first measurement, and then controlling the movement of the moving body based on a result of the first measurement for each of the predetermined normal shot region and the deficient shot region when the imprint process is performed in the deficient shot region.

* * * * *